(12) United States Patent
Chang et al.

(10) Patent No.: US 10,127,345 B2
(45) Date of Patent: Nov. 13, 2018

(54) METHOD FOR DETERMINING LOADING CURRENT OF CIRCUIT BOARD

(71) Applicant: Wistron Corporation, New Taipei (TW)

(72) Inventors: Ruey-Rong Chang, New Taipei (TW); Wen-Jui Kuo, New Taipei (TW); Feng-Ling Lin, New Taipei (TW); Tzu-Heng Yeh, New Taipei (TW)

(73) Assignee: Wistron Corporation, New Taipei (TW)

( * ) Notice: Subject to any disclaimer, the term of this patent is extended or adjusted under 35 U.S.C. 154(b) by 876 days.

(21) Appl. No.: 14/272,510

(22) Filed: May 8, 2014

(65) Prior Publication Data
US 2015/0192620 A1    Jul. 9, 2015

(30) Foreign Application Priority Data

Jan. 6, 2014   (TW) .............................. 103100401 A

(51) Int. Cl.
*G06F 17/50*    (2006.01)
(52) U.S. Cl.
CPC ................................ *G06F 17/5081* (2013.01)
(58) Field of Classification Search
CPC .... G06F 17/5081; H02B 1/202; H05K 7/1457
See application file for complete search history.

(56) References Cited

U.S. PATENT DOCUMENTS

| | | | | |
|---|---|---|---|---|
| 6,062,903 A | * | 5/2000 | Hawes | H01R 12/57 174/261 |
| 7,168,056 B2 | * | 1/2007 | Dong | G06F 17/5081 716/112 |
| 7,263,682 B2 | * | 8/2007 | Tsai | G06F 17/5081 716/112 |

* cited by examiner

*Primary Examiner* — Elias Desta
(74) *Attorney, Agent, or Firm* — JCIPRNET

(57) ABSTRACT

A method for determining a loading current of a circuit board is provided. In the method, outline positions of metal regions and hollowed regions in each of the metal regions are recorded. Metal widths corresponding to scan lines in circuit board are calculated in a sequence, so that a minimum metal width on each of the scan lines is acquired. According to the minimum metal width, a maximum loading current of each of the metal regions is calculated. In addition, a method and a system for filtering manufacturers are provided. A processing apparatus of the system analyzes the maximum loading current and manufacturing process parameters of the circuit board, calculates a weight score of a manufacturing process capability parameter table of each manufacturer according to the maximum loading current and manufacturing process parameters, and filtering the manufacturers to produce the best fit manufacturer list.

7 Claims, 3 Drawing Sheets

METHOD FOR DETERMINING LOADING CURRENT OF CIRCUIT BOARD

CROSS-REFERENCE TO RELATED APPLICATION

This application claims the priority benefit of Taiwan application serial no. 103100401, filed on Jan. 6, 2014. The entirety of the above-mentioned patent application is hereby incorporated by reference herein and made a part of this specification.

BACKGROUND OF THE INVENTION

1. Field of the Invention

The invention generally relates to a design scheme for a manufacturing process of circuit board, and particularly to a method and a system for filtering a plurality of circuit board manufacturers based on a method for determining a loading current of the circuit board.

2. Description of Related Art

The printed circuit board (PCB) is a circuit substrate formed by designing copper sheet traces in layout and pattern according to a circuitry design, which is utilized to be assembled with various electronic components as to construct an electronic circuit module. The technique for foiiiiing layouts during the manufacturing process of the PCB would affect the efficiency of the PCB after the manufacturing process. If the copper sheet area or a power plane is not sufficient, an excessive amount of current following through a trace on the PCB would damage the PCB. Therefore, a capable of loading current carried by the PCB is one of major factors for fabricating PCB. However, PCB design engineers usually design the PCB by utilizing a well-known and fixed ratio between a metal width and the loading current. Such design would risk damages on the PCB, at the same time, spaces on the PCB may be wasted.

In addition to the layout procedure, the manufacturing process of the PCB further includes procedures such as a drill process, a solder mask process, surface finish, and the likes. Each of the procedures may affect the performance of the PCB. Furtheimore, PCB having different circuit designs would have different requirements for each of the manufacturing process, and the capability for handling each of the manufacturing process would be different between different PCB manufacturers. Therefore, a method for effectively filtering the PCB manufacturers that satisfy the circuit design is needed.

SUMMARY OF THE INVENTION

The invention provides a method for determining a loading current of a circuit board and a system and a method for filtering a plurality of circuit board manufacturers, so as to quickly obtain a maximum loading current of each region on the circuit board and to effectively select the manufacturers that satisfy the circuit board design.

The disclosure provides a method for determining a loading current of a circuit board, and the method includes the following steps. An outline position of a metal region on the circuit board is recorded, and an outline position of a hollowed region in each metal region is recorded. A plurality of metal widths corresponding to a plurality of scan lines of the circuit board is calculated, sequentially, to obtain a minimum metal width of each of the scan lines. In addition, a maximum loading current of each of the metal regions is calculated according to the minimum metal width.

According to an exemplary embodiment of the disclosure, the hollowed region includes a regular region and an irregular region, the step of recording the outline position of a metal region on the circuit board and recording the outline position of the hollowed region in each metal region includes the following steps. The outline position of the metal region is recorded to an outline position table, and an outline position of the regular region and an outline position of the irregular region in each metal region are recorded to a hollowed position table.

According to an exemplary embodiment of the disclosure, the step of recording the outline position of the regular region and the outline position of the irregular region in each metal region to the hollowed position table includes the following steps. A center position, a radius and an occupied area of each regular region is recorded when the regular region is in a circular shape, wherein the occupied area is recorded according to the outline position of each regular region. In addition, the outline position of the irregular region is recorded to establish an irregular shape table.

According to an exemplary embodiment of the disclosure, the step of recording the outline position of the regular region and the outline position of the irregular region in each metal region to the hollowed position table includes the following steps. A rectangular such as square is generated according to the outline position of each regular region, and a plurality of sides of the square are recorded as a basis of a size of each regular region.

According to an exemplary embodiment of the disclosure, the scan lines comprises a plurality of horizontal scan lines and a plurality of vertical scan lines, and the step of sequentially calculating the metal widths corresponding to the scan lines of the circuit board includes the following steps. A length of a metal trace of the circuit board located on each of the horizontal scan lines is respectively calculated according to the horizontal scan lines, wherein the calculated length of the metal trace is utilized as each of the metal widths. In addition, a length of the metal trace of the circuit board located on each of the vertical scan lines is respectively calculated according to the vertical scan lines, wherein the calculated length of the metal trace is utilized as each of the metal widths.

According to an exemplary embodiment of the disclosure, the step of respectively calculating the length of the metal trace of the circuit board located on each of the horizontal scan lines, and respectively calculating the length of the metal trace of the circuit board located on each of the vertical scan lines includes the following steps. A most top and a most bottom of the outline position of each metal region from the outline position table are obtained as a starting horizontal line and an ending horizontal line. The length of the metal trace on each of the horizontal scan lines is calculated to be the metal widths in a sequence starting from the starting horizontal line to the ending horizontal line. A most left edge and a most right edge of the outline position of each metal region are obtained from the outline position table as a starting vertical line and an ending vertical line, and the length of the metal trace on each of the vertical scan lines is calculated to be the metal widths in a sequence starting from the starting vertical line to the ending vertical line.

According to an exemplary embodiment of the disclosure, the step of sequentially calculating the metal widths corresponding to the scan lines of the circuit board includes the following step. The metal widths may be obtained by sequentially subtracting the length of each of the scan lines overlapped with the hollowed region from the length of each of the scan lines in the metal region.

According to an exemplary embodiment of the disclosure, the step of calculating the maximum loading current of each metal region according to the minimum metal width of each metal region includes the following steps. A voltage value for each metal region is obtained. The minimum metal width of each metal region is utilized as a trace width, and the maximum loading current of each metal region is calculated according the voltage value, the trace width and thickness of each metal region.

The disclosure provides a system for filtering a plurality of circuit board manufacturers, and the system includes a database and a processing apparatus. The database stores a manufacturing process capability parameter table and an existing parameter data. The processing apparatus is coupled to the database, and the processing apparatus is configured for analyzing a maximum loading current of the circuit board, analyzing a plurality of manufacturing process parameters. The processing apparatus loads the manufacturing process capability parameter table of each of the manufacturers and the existing parameter data, a weight score for each of the manufacturers in the manufacturing process capability parameter table is calculated according to the manufacturing process parameters and the maximum loading current of the circuit board, and a best fit manufacturer list is produced by filtering the manufacturers according to the existing parameter data and the weight score.

According to an exemplary embodiment of the disclosure, the processing apparatus compares the manufacturing process parameters and the maximum loading current with parameters recorded in the manufacturing process capability parameter table for each of the manufacturers to assign a weight for each of the parameters in the manufacturing process capability parameter table, and sums the weight of each of the parameters to obtain the weight score for each manufacturer.

According to an exemplary embodiment of the disclosure, the processing apparatus calculates a cost effectiveness of the circuit board for each of the manufacturers according to the existing parameter data, and compares the cost effectiveness and the weight score of each of the manufacturers to filter the manufacturers to produce the best fit manufacturer list.

The disclosure provides a method for filtering a plurality of circuit board manufacturers, and the method includes the following steps. A maximum loading current of a circuit board and a plurality of manufacturing process parameters are analyzed. A manufacturing process capability parameter table of each of the manufacturers and an existing parameter data are loaded. A weight score of each of the manufacturer listed on the manufacturing process capability parameter table is calculated according to the manufacturing process parameter and the loading current of the circuit board. The best fit manufacturer list is produced by filtering the manufacturers according to the existing parameter data and the weight score.

According to an exemplary embodiment of the disclosure, the step of calculating the weight score of each of the manufacturers in the manufacturing process capability parameter table according to the manufacturing process parameter and the loading current of the circuit board includes the following step. The manufacturing process parameter and the maximum loading current of the circuit board with the manufacturing process capability parameter table are compared to assign a weight for each of the parameters in the manufacturing process capability for each manufacturer, and the weight of each of the parameters are summed to obtain the weight score of each of the manufacturers.

According to an exemplary embodiment of the disclosure, the step of producing the best fit manufacturer list by filtering the manufacturers according to the existing parameter data and the weight score includes the following steps. A cost effectiveness of the board and each manufacturer is calculated according to the existing parameter data. In addition, the cost effectiveness and the weight score of each of the manufacturers are compared with to filter the manufacturers for producing the best fit manufacturer list.

Accordingly, the exemplary embodiments of the disclosure may analyze the circuit board to determine a minimum metal width of each metal region (e.g., copper sheet region) on the circuit board in a horizontal plane and/or a vertical plane, so as to determine a maximum loading current that each metal region may carries. Furthermore, the system for filtering the manufacturers compares the maximum loading current, parameters for each of manufacturing process and pre-recorded parameter data and sums the weights, so as to filter manufactures by utilizing a sum of the weights. In other words, the PCB design engineer may quickly and accurately obtain the maximum loading current of each circuit board to effectively filter the manufacturers for producing the best fit manufacturers that satisfies the circuit board design.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

For quickly calculating a maximum loading current of a printed circuit board (PCB), a method for determining the loading current of a circuit board is provided. The method computes an outline position of a metal region (e.g., a copper sheet) and hollowed regions with regular or irregular outlines to calculate a minimum metal width of the metal region where the current may flow though, so as to determine the maximum loading current of the circuit board. Furthermore, a system for filtering a plurality of circuit board manufacturers is provided, which effectively filters PCB manufacturers that satisfies the desire circuit board design. The system for filtering the circuit board manufacturers calculates a weight score corresponding to the manufacturing process capability of each of the manufacturers according to the calculated maximum loading current and each of the manufacturing process parameters through a processing apparatus, so as to filter the manufacturers according to existing parameters that is predefined and weight scores. Thus, the metal widths of the PCB may be obtained quickly and accurately, so as to provide the maximum loading current to a user or manufacturers. Thereby, the designed PCB may be given to a most fit manufacturer for production.

Figure 1:
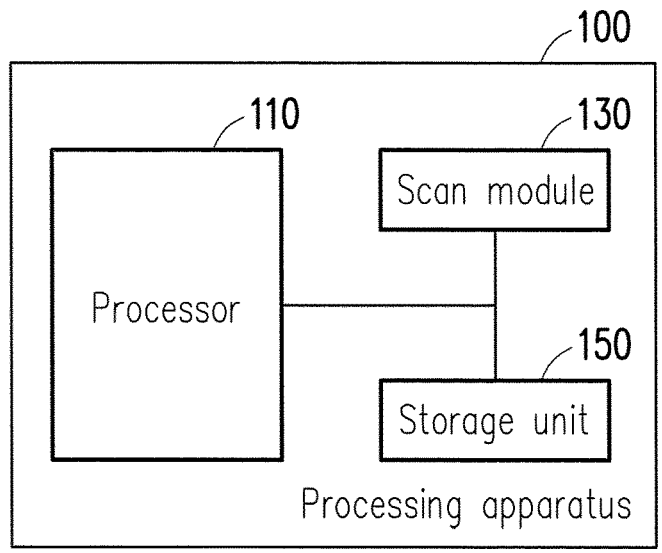
FIG. 1 is a schematic diagram of a processing apparatus executing a method for determining a loading current of a circuit board according to an embodiment of the disclosure.

FIG. 1 is a block diagram illustrating a processing apparatus executing a method for determining the loading current of the circuit board according to an exemplary embodiment of the disclosure. With reference to FIG. 1, a processing apparatus 100 includes a processor 110, a scan module 130 and a storage unit 150.

The processor 110 may be a Central Processing Unit (CPU), any programmable microprocessor for general or special purposes, a Digital Signal Processor (DSP), a programmable controller, an Application Specific Integrated Circuit (ASIC) or the likes or any combination of the aforementioned components. In the present exemplary embodiment, the processor 110 is configured to process all of the operations for the processing device 100 of the exemplary embodiment.

The scan module 130 is configured to scan the PCB to convert a circuitry layout into an image, text, table or any other formats, so as to calculate the parameters of the circuit boards such as position and size of vias, holes, each component, etc in the cir circuit board.

The storage unit 150 may be any type of fixed or portable random access memory (RAM), a read-only memory (ROM), a flash memory or the likes. In the present exemplary embodiment, the storage unit 150 is configured to record data calculated by the processing unit 110 and images, tables, or other parameters of the PCB scanned by the scan module 130.

The loading current of the PCB is related to a cross-area of a cross-section of metal (e.g., copper sheet) on a trace and a temperature variation, and the loading current may be calculated by the following equation (1), $$I = K\Delta T^{0.44} A^{0.75}, \quad (1)$$

where K is a coefficient (e.g., 0.024 or 0.048), $\Delta T$ is a maximum temperature variation (i.e., unit in Celsius (° C.)), A is the cross-area of a cross-section of the metal (unit is milt). A PCB engineer usual designs the layout of the PCB by referring to a ratio where a current of 1 ampere corresponds to a metal width of 40 mil. However, it is not necessary to design the width of every metal trace of the PCB according to the ratio.

Since the engineer may determine the cross-area, length and thickness of the cross-section of the metal, and a resistance of the metal varying with temperature, the engineer may calculate the metal width according to the following equation (2).

$$\Delta V = IR = I(\rho L/A), \quad (2)$$

wherein the $\Delta V$ is a voltage variation, I is the carrying current, R is a resistance of the meal, and $\rho$ is a resistivity, L is a length of the metal trace, A is the cross-area of the metal trace (i.e., a multiplication of the thickness and width).

For example, assuming that the voltage is 5V, the voltage change is $\Delta V$ is 2%, the loading current is 1 amp, the metal thickness is 1.2 mil, and the resistivity of the copper sheet is 0.67 mircohm-inches ($\mu\Omega$.in). When the metal width is 40 mil, the length L of the metal trace may be approximately 7000 mil. On the contrary, the length of the metal trace corresponding to 21 mil of the metal width is 3500 mil. Clearly, a design having 40 mil of the metal width occupies a large amount of space. Therefore, the minimum metal width of each of the traces on the PCB can be calculated to maximize the usage of the space on the PCB. As a result, the size of the PCB can be reduced, and products are more competitive.

However, the PCB has many hollowed regions (e.g., a via, a void, etc.) for design requirements, which makes it difficult to calculate the minimum metal width of the PCB. In order to quickly and accurately calculate the minimum metal width for obtaining the maximum loading current of each of the metal regions, the disclosure records a position and a size of each of metal regions and the hollowed regions and calculates the maximum loading current.

Figure 2:
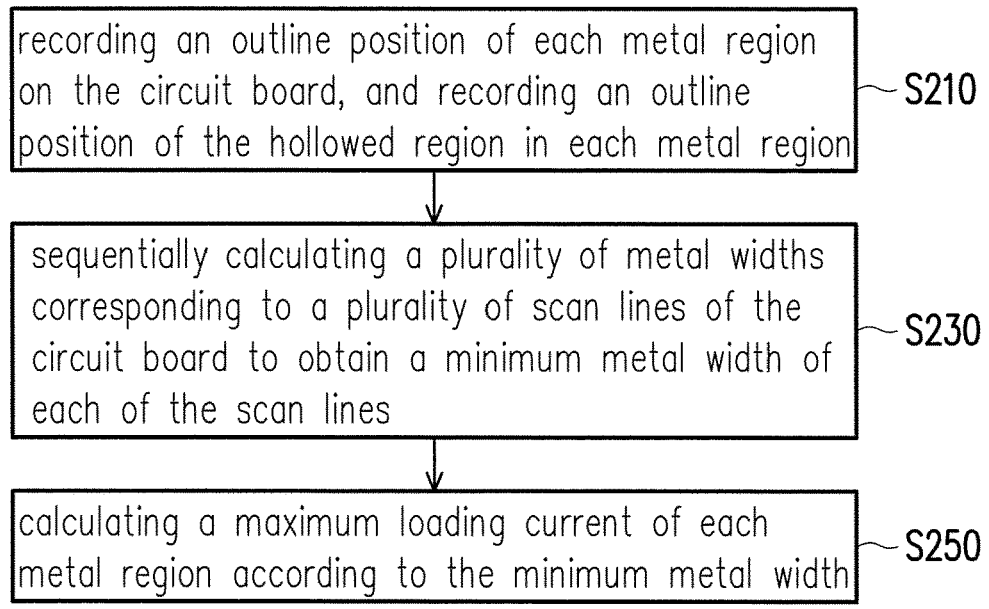
FIG. 2 is a flow diagram illustrating a method for deteimining the loading current of a circuit board according to an exemplary embodiment of the disclosure.

FIG. 2 is a flow diagram illustrating a method for determining the loading current of a circuit board according to an exemplary embodiment of the disclosure. The method illustrated in FIG. 2 is configured for the processing apparatus 100 illustrated in FIG. 1. In the following, the method for determining the loading current of the circuit board accompanied with each module and component of the processing apparatus 100 is described in detail. However, the disclosure is not limited thereto, each of the steps in the method may be adjusted according to the practical implementation.

In step S210, the processor 110 of the processing apparatus 100 records an outline position of each of the metal regions on the circuit board as well as an outline position of the hollowed regions within each of the metal regions. In detail, PCB engineers may design a circuit layout by utilizing layout software (e.g., Allegro, PADS, etc.). Afterward, the scan module 130 scans the circuit layout, and then coverts the circuit layout into any format of image, text, table, etc., which may be utilized for calculating a plurality of parameters of the circuit board such as a position and a size of each components, vias, holes, and the likes on the circuit board. In other exemplary embodiments, the processing unit 100 further includes a scanner (e.g., a camcorder, a camera, and an image scanner). The scanner may scan a physical PCB, and then transmits the scan data to the scan module 130.

In the present embodiment, the processor 110 records the outline position of the metal regions in an outline position table. For example, for every 1 mil, the processor 110 records a coordinate for the outline position of each of the metal regions (e.g., by using a left and bottom corner of the PCB as an origin). In other exemplary embodiments, the interval for recording the coordinate may be 3 mil, 10 mil, etc., which the disclosure is not limited thereto. In an exemplary embodiment, the processor 100 may further arrange the metal regions in a sequence and assign a number to each of the metal regions for the following calculation or verification.

It should be noted that, in an exemplary embodiment, the hollowed regions includes a plurality of regular regions (e.g., vias and holes having circular shape) and a plurality of irregular regions (e.g., holes having irregular shapes). The processor 110 records the outline position of the regular and irregular regions within each of the metal regions to a hollowed region position table and stores the hollowed region position table in the storage unit 150. When each of the regular regions are circles, the processor 110 records a center position (e.g., by using the left and bottom corner of the PCB as the origin of the coordinate system), a radius (or a diameter) and occupied area of each of the regular regions, where the occupied area is recorded according to the outline position of each of the regular regions (e.g., the outline positions of the top edge, bottom edge, left edge and right edge of the circular regular regions). In an exemplary embodiment, a plurality of squares are generated according to the outline position of each of the circular regular regions, and each sides of square are recorded as a basis for a size of each of the circular regular regions. Furthermore, the processor 110 records an outline position of each of the irregular regions to establish an irregular shape table, and the processor 110 stores the irregular shape table to the storage unit 150. The method of establishing the irregular shape table may be deduced from the method of establishing the outline position table of each of the metal regions, and thus it is omitted.

In other exemplary embodiments, the hollowed regions may only include the regular regions or irregular regions. The method of recording the position and size of the regular and irregular regions may be deduced from the aforementioned description, and thus it is omitted here.

Figure 3:
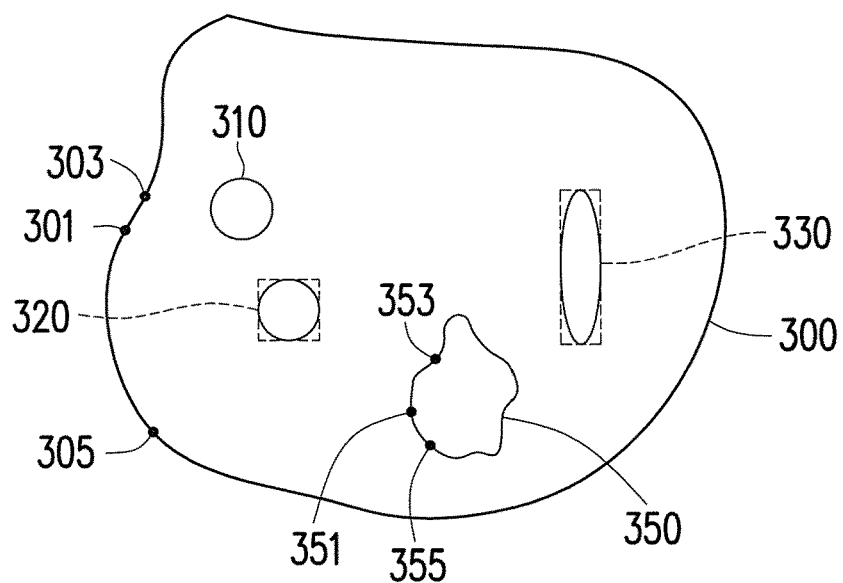
FIG. 3 is a diagram utilized to illustrate the outline position table, hollowed position table and irregular shape table according to an exemplary embodiment of the disclosure.

FIG. 3 is a diagram utilized to illustrate the outline position table, hollowed position table and irregular shape table according to an exemplary embodiment of the disclosure. In the exemplary embodiment, a copper sheet 300 includes a plurality of regular regions 310, 320 and 330 (e.g., vias) and an irregular region 350 (e.g., holes). The processor 110 records a plurality of outline positions 301, 303 and 305 of the copper sheet 300 in a table (1) (which is illustrated below) of the outline position table, where (x1, y1), (x2, y2) and (x3, y3) are respectively a coordinate of the outline positions 301, 303, 305. Other entries in the table may be deduced, and thus omitted.

TABLE (1)

| Outline position table | | |
|---|---|---|
| 301 | x1 | y1 |
| 303 | x2 | y2 |
| 305 | x3 | y3 |
| ... | ... | ... |

The processor 110 records the regular regions 310, 320, 330 and the irregular region 350 in the hollowed position table which is, for example, illustrated below as table (2), where (xs1, ys1), (xs2, ys2) and (xs3, ys3) are the center position coordinates of the regular regions 310, 320, 330, respectively. The values recording in a size column respectively represent a diameter of the regular region 310, a length of the regular region 320 and a length and width of the regular region 330. In addition, an occupied area column is configured to record areas of a plurality of rectangular shapes that respectively includes the regular regions 310, 320, 330, where the rectangular shapes are respectively centered by using the center positions of the regular regions 310, 320, 330.

TABLE (2)

| Hollowed position table | | | | | |
|---|---|---|---|---|---|
| Region | Position | | Size | Occupied Area | |
| 310 | xs1 | ys1 | 20 | xs1 − 10: xs1 + 10 | ys1 − 10: ys1 + 10 |
| 320 | xt1 | yt1 | 20 | xt1 − 10: xt1 + 10 | yt1 − 10: yt1 + 10 |
| 330 | xv1 | yv1 | 20  60 | xv1 − 10: xv1 + 10 | yv1 − 30: yv1 + 30 |
| 350 | Irregular region | | | | |

Furthermore, the irregular region are recorded in the irregular shape table which is, for example, illustrated below as table (3), where (x4, y4), (x5, y5) and (x6, y6) are respectively a coordinate of the outline positions 351, 353, 355.

TABLE (3)

| Irregular Shape Table | | |
|---|---|---|
| 351 | x4 | y4 |
| 353 | x5 | y5 |
| 355 | x6 | y6 |
| ... | ... | ... |

Referring back to the process flow illustrated in FIG. 2, in step S230, the processor 110 calculates a plurality of metal widths corresponding to a plurality of scan lines in a sequence, so as to obtain a minimum metal width for each of the scan lines. In an exemplary embodiment, the processor 110 respectively calculates a length of a metal trace of the circuit board located on each of the horizontal scan lines according to the horizontal scan lines, wherein the calculated length of the metal trace is utilized as each of the metal widths, and respectively calculates a length of the metal trace of the circuit board located on each of the vertical scan lines according to the vertical scan lines, wherein the calculated length of the metal trace is utilized as each of the metal widths. In detail, the processor 110 may obtain the outline positions of the most top edge and the most bottom edge of each of the metal regions from the outline position table stored in the storage unit 150 as a start and an end of the horizontal scan lines. The lengths of the metal traces located on each of the horizontal scan lines may be calculated in a sequence starting from a starting horizontal scan line to an ending horizontal scan line. In addition, the processor 110 may obtain the outline positions of the most left edge and the most right edge of each of the metal regions from the outline position table stored in the storage unit 150 as a start and an end the vertical scan lines. The lengths of the metal traces located on each of the vertical scan lines may be calculated in a sequence starting from a starting vertical scan line to an ending vertical scan line.

It should be noted that, in the present embodiment, the processor 110 may obtain the metal widths of the metal regions by subtracting a length of each of the scan lines overlapped with the hollowed region from a length of each of the scan lines in the metal regions. Since, the processor 110 has recorded information related to the position, size and area of the hollowed regions in the hollowed position table, the processor 110 would know the sections of each scan lines that overlap with the hollowed regions. Thus, the lengths of the scan lines that are not overlapped with the hollowed regions may be calculated.

In the above-mentioned embodiment, the processor 110 calculates the metal widths of each of the metal regions in a sequence according to the horizontal and vertical scan lines. However, in other embodiments, the processor 110 may calculate the metal widths of each of the metal regions according to a diagonal direction or any other particular directions, and thus it is not limited thereto.

In step S250, the processor 110 may calculate a maximum loading current of the metal regions according to a minimum metal width. In detail, the processor 110 may obtain the minimum metal width of each of the metal regions according to the metal widths of each of the scan lines calculated in step S230. In the present embodiment, the processor 110 obtains a voltage value of each of the metal regions from the storage unit 150 and utilizes the minimum metal width of each of the metal regions as the trance width. Accordingly, the processor 110 calculates the maximum loading current of each of the metal regions by utilizing the voltage value, the trance width and thickness in the equation (2).

In an exemplary embodiment, the processing apparatus 100 further includes a display (e.g., a Liquid Crystal Display, LCD), an Organic Electro-Luminescent Display, OLED, etc). The processor 110 may display the circuit layout accompanied with the maximum loading current of each of the metal regions on the display, where the current may be displayed in a single starting point corresponding to multiple point. In an exemplary embodiment, the processor 110 may analyze a current flowing direction according to the calculated loading current, designed voltage, resistance of the metal, etc.

Accordingly, the engineer may quickly obtain a correct metal width of the circuit board, so as to obtain the maximum loading current for manufacturers or users. Alternatively, the engineer may verify whether the calculated maximum loading current satisfies the design requirement of the circuit layout. For example, when the calculated maximum loading current is large, then the engineer may reduce the corresponding metal width. Furthermore, the engineer may also consider the influence of the resistivity of the metal (e.g., temperature), so as to advise the manufacturers on the parameter adjustments.

In the above-mentioned embodiment, the minimum metal width and the maximum loading current of each of the metal regions of the PCB may be obtained. However, the parameters of manufacturing the PCB are not limited to the metal width and the loading current, different manufacturing process may have different parameters to consider. For example, a minimum trace width/minimum gap between the traces, a minimum distance to the conductor, etc. are to be considered in an inner layer and an external layer photolithography process. Furthermore, parameters such as a minimum drill bit size, a minimum hole size, etc. are to be considered in a drilling process. Parameters such as a solder mask process anti-solder alignment, a minimum font width, etc. are to be considered for a solder mask process. In addition, there are other parameters in a silkscreen printing process, a routing process, etc. Therefore, it is a challenge for the engineers to select PCB manufacturers, so as to maximize the production of the PCB.

In order to quickly and effectively filters a plurality of best fit manufacturers, the exemplary embodiments of the disclosure considers the maximum loading current of the PCB, all of the parameters for manufacturing process and the cost effectiveness. Thus, the capability of each of the manufacturers may be listed according to the needs of the effectiveness of the PCB, so as to filter the manufacturers that meet the needs.

Figure 4:
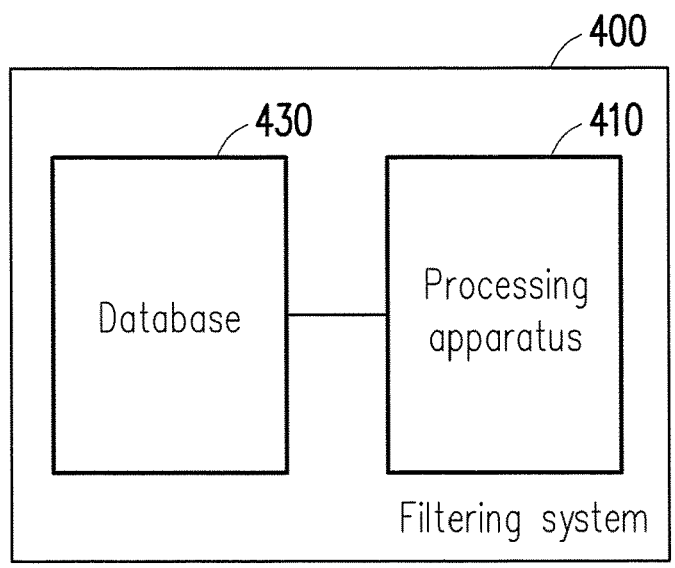
FIG. 4 is a block diagram illustrating a system for filtering the circuit board manufacturers according to an exemplary embodiment of the disclosure.

FIG. 4 is a block diagram illustrating a system for filtering the circuit board manufacturers according to an exemplary embodiment of the disclosure. With reference to FIG. 4, the system includes a processing apparatus 410, and a database 430.

The processing apparatus 410 may be a processing apparatus of a computer system such as a desktop computer, a laptop computer, a tablet computer, etc. In the embodiment, the processing apparatus 410 is configured to process all of the operations performed by the filtering system 400 for filtering the circuit board manufacturers of the present embodiment. The database 430 may be an online database (e.g., a server), a networked attached storage (NAS), an internal or an external storage apparatus (e.g., a hard-disk, a memory, etc.). The database 430 is configured to store data computed by the processing apparatus 410, such as data related to a manufacturing process capability table of each of the manufacturers and an existing parameter data (e.g., parameter data from previous project).

Figure 5:
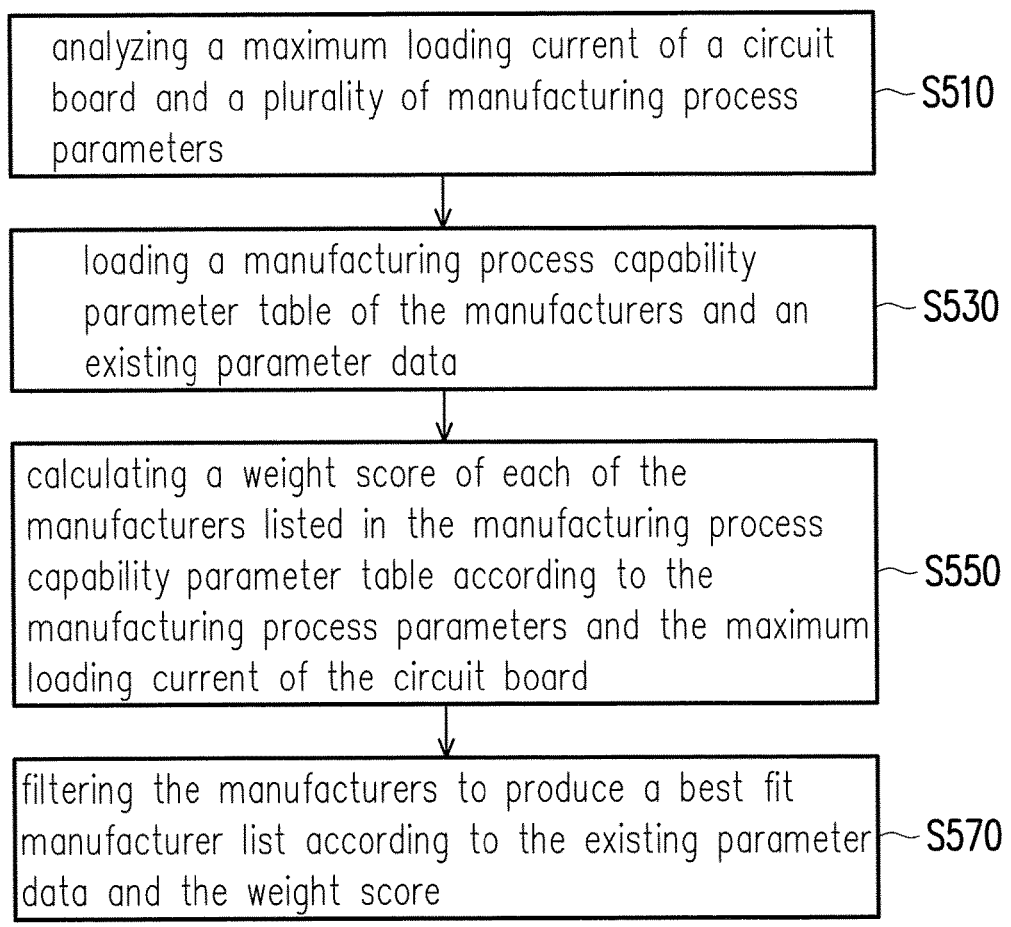
FIG. 5 is flow diagram illustrating a method for filtering the circuit board manufacturers according to an exemplary embodiment of the disclosure.

FIG. 5 is flow diagram illustrating a method for filtering the circuit board manufacturers according to an exemplary embodiment of the disclosure. With reference to FIG. 5, the method for filtering the circuit board manufactures is configured for the filtering system 400 for filtering the circuit board manufacturers illustrated in FIG. 4. In the following, the method of the embodiment is accompanied with each of the apparatus and components illustrated in the filtering system 400. Each step of the method may be adjusted according to the practical condition, and thus it is not limited thereto.

In step S510, the processing apparatus 410 analyzes a maximum loading current of the circuit board as well as a plurality of manufacturing process parameters of circuit board. In detail, the processing apparatus 410 loads a layout of a PCB (e.g., obtained by utilizing a scanner to scan the physical PCB or obtained by scanning the circuit layout of the engineer through the scan module 130 illustrated in FIG. 1). Based on the method for determining the loading current of the circuit board, a maximum loading current of the PCB may be obtained as one of the manufacturing process parameters, a plurality of manufacturing process parameters required for each of the manufacturing processes (e.g., anti-solder alignment, a minimum distance to the conductor, and etc.) may be calculated.

In step S530, the processing apparatus 410 loads a manufacturing process capability parameter table and existing parameters from the database 430. It should be noted that a plurality of manufacturing processes capability parameters for each of the manufacturing process are pre-stored in the database 430. Therefore, the processing apparatus 410 may produce a manufacturing process capability parameter table according to the manufacturing processes capability of each of the manufacturers. The manufacturing process capability parameter table may record and arrange the manufacturers in quality scores, percentages, rankings, etc.

In step S550, the processing apparatus 410 calculates a weight score for each of the manufacturers in the manufacturing process capability parameter table according to the manufacturing process parameters and the loading current of the circuit board. In detail, the processing apparatus 410 compares the manufacturing process parameters and the loading current of the circuit board with the parameters in the manufacturing process capability parameter table to give the weight score of each of the parameters for the manufacturers in the manufacturing process capability parameter table. For example, the engineer has higher standard for the minimum trace width/minimum trace distance, so the weight score for the minimum trace width/minimum trace distance may be set to 2. The manufacturing processes capability parameter of the minimum trace width/minimum trace distance may be 3 (i.e., out of total of 5), and the weight score of such manufacturing processes capability parameter is 6. Alternatively, certain manufacturing processes capability parameter is configured to reach a minimum score. Furthermore, the processing apparatus 410 may further record a sum of each of the manufacturing processes capability parameter in a weight score table illustrated as a table (4) for further process or the engineer to select.

TABLE (4)

Weight score Table

| | |
|---|---|
| Manufacturer A | 67 |
| Manufacturer B | 65 |
| Manufacturer C | 45 |
| Manufacturer D | 35 |
| ... | ... |

In step S570, the processing apparatus 410 composes a list having best fit manufacturers according to the existing parameter data and the weight score. In detail, the processing apparatus 410 calculates the cost effectiveness of the circuit board and each of the manufacturers according to the existing parameter data. For example, the existing parameter data may be the production and assembly qualities, capability, price, etc. of a manufacturer C from prior projects/jobs. In addition, the processing apparatus 410 compares the cost of each of the manufacturers and the weight score calculated in step S550 to filter the manufacturers for producing the best fit manufacturer list. For example, the processing apparatus 410 may list each of the manufacturers by the weight score, manufacturing processes deficiencies parameters and cost effectiveness for the engineer or the processing apparatus 410 to select a top three manufacturers. Furthermore, the filtering method of the embodiment may further incorporate the method for determining the loading current after the best fit manufacturers are filtered to provide the parameter adjustments to the manufacturers, so as to facilitate subsequent design changes.

In summary, a method for dete mining a loading current of a circuit board records an outline position of each of the metal regions and each of the hollowed regions. Then, a minimum metal width of a plurality of metal regions which the current may flow through is calculated, and the maximum loading current of the circuit board may be determined according to the minimum metal width. Furthermore, a system for filtering a plurality of circuit board manufacturers filters the manufacturers according to the maximum loading current, pre-recorded parameter data and each of the manufacturing process parameters. Thereby, the PCB engineer may quickly and accurately obtain the maximum loading current of each of the circuit board, so as to effectively select a plurality of best fit manufacturers according to the maximum current and each of the manufacturing process parameters.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A method for detecting a loading current of a circuit board, comprising:
    scanning by a scan module the circuit layout and recording by a processor an outline position of at least one metal region on the circuit board to an outline position table, and recording by the processor an outline position of at least one hollowed region in each of the at least one metal region;
    sequentially calculating by the processor a plurality of metal widths corresponding to a plurality of scan lines of the circuit board, wherein the scan lines comprise a plurality of horizontal scan lines and a plurality of vertical scan lines, after excluding the at least one hollowed region from each of the at least one metal region based on the at least one recorded outline position of the at least one metal region and the at least one recorded hollowed region in each of the at least one metal region, by respectively calculating a length of a metal trace of the circuit board located on each of the horizontal scan lines according to the horizontal scan lines, wherein the calculated length of the metal trace is utilized as each of the metal widths, and respectively calculating a length of the metal trace of the circuit board located on each of the vertical scan lines according to the vertical scan lines, wherein the calculated length of the metal trace is utilized as each of the metal widths;
    calculating by the processor a minimum metal width of each of the scan lines according to the plurality of metal widths; and
    determining by the processor a maximum loading current of each of the at least one metal region according to the minimum metal width of each of the at least one metal region so that the at least one metal region of the circuit board is adjusted according to the maximum loading current.

2. The method as claimed in claim 1, wherein the at least one hollowed region includes at least one regular region and at least one irregular region, wherein the step of recording the outline position of the at least one metal region on the circuit board and recording the outline position of the at least one hollowed region in the at least one metal region comprises:
    recording an outline position of the at least one regular region and an outline position of the at least one irregular region in each of the at least one metal region to a hollowed position table.

3. The method as claimed in claim 2, wherein the step of recording the outline position of the at least one regular region and the outline position of the at least one irregular region in each of the at least one metal region to the hollowed position table comprises:
    recording a center position, a radius and an occupied area of each of the at least one regular region when each of the at least one regular region is in a circular shape, wherein the occupied area is recorded according to the outline position of each of the at least one regular region; and
    recording the outline position of each of the at least one irregular region to establish an irregular shape table.

4. The method as claimed in claim 2, wherein the step of recording the outline position of the at least one regular region and the outline position of the at least one irregular region in each of the at least one metal region to the hollowed position table comprises:

generating a rectangular according to the outline position of each of the at least one regular region, and recording a plurality of sides of the rectangular as a basis for calculating a size of each of the at least one regular region.

5. The method as claimed in claim 1, wherein the step of respectively calculating the length of the metal trace of the circuit board located on each of the horizontal scan lines, and respectively calculating the length of the metal trace of the circuit board located on each of the vertical scan lines comprises:

obtaining a most top and a most bottom of the outline position of each of the at least one metal region from the outline position table as a starting horizontal line and an ending horizontal line;

calculating the length of the metal trace on each of the horizontal scan lines to be the metal widths in a sequence starting from the starting horizontal line to the ending horizontal line;

obtaining a most left edge and a most right edge of the outline position of each of the at least one metal region from the outline position table as a starting vertical line and an ending vertical line; and calculating the length of the metal trace on each of the vertical scan lines to be the metal widths in a sequence starting from the starting vertical line to the ending vertical line.

6. The method as claimed in claim 1, wherein the step of sequentially calculating the metal widths corresponding to the scan lines of the circuit board comprises:

sequentially subtracting a length of each of the scan lines overlapped with the at least one hollowed region from a length of each of the scan lines in the at least one metal region to obtain the metal widths.

7. The method as claimed in claim 1, wherein the step of calculating the maximum loading current of each of the at least one metal region according to the minimum metal width of each of the at least one metal region comprises:

obtaining a voltage value for each of the at least one metal region; and utilizing the minimum metal width of each of the at least metal region as a trace width, and calculating the maximum loading current of each of the at least one metal region according the voltage value, the trace width and thickness of each of the at least one metal region.

* * * * *